United States Patent
Greenfeld

(10) Patent No.: US 6,819,154 B2
(45) Date of Patent: Nov. 16, 2004

(54) CONSTANT DEADTIME CONTROL IN A FEED FORWARD ENABLED PULSE WIDTH MODULATOR CONTROLLER

(75) Inventor: Fred F. Greenfeld, Melbourne Beach, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/357,066

(22) Filed: Feb. 3, 2003

(65) Prior Publication Data

US 2004/0150439 A1 Aug. 5, 2004

(51) Int. Cl.[7] .................................................. H03K 4/06
(52) U.S. Cl. ........................ 327/172; 327/140; 363/41
(58) Field of Search ................................ 327/172, 175, 327/178, 140, 131; 363/41, 40

(56) References Cited

U.S. PATENT DOCUMENTS

| | | | |
|---|---|---|---|
| 4,316,155 A | * | 2/1982 | Hanisko ..................... 331/18 |
| 5,394,020 A | * | 2/1995 | Nienaber .................... 327/140 |
| 5,414,342 A | | 5/1995 | Mammano et al. ......... 323/288 |
| 6,381,154 B1 | * | 4/2002 | Nguyen ....................... 363/41 |

* cited by examiner

Primary Examiner—Dinh T. Le
(74) Attorney, Agent, or Firm—Allen, Dyer, Doppelt, Milbrath & Gilchrist, P.A.

(57) ABSTRACT

A feed forward pulse width modulator compares a ramp signal with a control voltage to control respective states of a pulse width modulation signal. A respective cycle of the ramp signal is generated by charging a capacitor with a charging current that is proportional to input voltage until the voltage across the capacitor reaches a peak threshold that is also proportional to the input voltage. The capacitor is thereupon discharged with a discharging current proportional to the input voltage until the voltage across the capacitor reaches a (non-zero) valley threshold.

2 Claims, 1 Drawing Sheet

CONSTANT DEADTIME CONTROL IN A FEED FORWARD ENABLED PULSE WIDTH MODULATOR CONTROLLER

FIELD OF THE INVENTION

The present invention relates in general to DC power supply circuits and components therefor, and is particularly directed to a new and improved feed forward enabled pulse width modulator (PWM) circuit, that is configured to operate at a constant switching frequency, and maintains a fixed deadtime by adjusting timing capacitor discharge current in accordance with variation in input voltage. This serves to maintain the deadtime interval of the PWM signal predictably constant.

BACKGROUND OF THE INVENTION

Electrical power for an integrated circuit (IC) is typically supplied by one or more direct current (battery) power sources, such as a pulse width modulation (PWM)-based, DC-DC converter. This type of converter contains a PWM signal generator that supplies a synchronous PWM signal to a switching circuit driver. The switching circuit drive, in turn, controls the on-time and off-time of electronic power switching devices as is known in the art.

The pulse width modulator (PWM) circuit itself is typically implemented using a comparator which compares an output signal from a control amplifier with a ramp waveform signal. The comparator output has a first state, when the output signal is greater than the ramp voltage and a second state when the voltage level of the ramp waveform has a value greater than the output voltage of the control amplifier. Thus, the duty cycle of the PWM waveform may be controlled by the output voltage of the control amplifier.

The ramp waveform itself may be generated by charging a timing capacitor with a current that is derived from the input voltage, using a resistor coupled between the input voltage source and a first terminal of the capacitor. In this 'feed forward' type of circuit, since the resistor is coupled to the same input voltage source that is supplying energy to the load, a variation in input voltage level causes an associated variation in charging current to the capacitor. Thus, an increase in the voltage level of the ramp signal will cause an increase in ramp slope, which results in the ramp voltage becoming greater than the voltage level of the control amplifier output signal in a relatively shorter period of time.

Conversely, for a decrease in input voltage, the slope of the ramp signal voltage decreases, so that it takes a longer period of time for the voltage level of the ramp signal to reach the control amplifier output voltage level. This results in a relatively longer PWM output pulse. Thus, when the input voltage is relatively large, the output PWM generator's output pulse-width is relatively narrow, and when the input voltage is relatively small the PWM generator's output pulse is relatively wide. Since, energy is proportional to the product of the voltage amplitude and the time duration that the voltage is applied to the load, such a PWM architecture is ideally intended to deliver constant energy to the output regardless of the input voltage.

This type of a circuit may be operated at a constant switching frequency, by coupling a switch in parallel with the capacitor terminals and operating the switch with a fixed frequency oscillator. The switch should be switched for a duration of time long enough to discharge the capacitor. In the on-state, the switch provides a very low impedance, so that the capacitor rapidly discharges in an amount of time which is negligible with respect to the time of a full period.

In such a circuit however, it is often desirable to provide a time interval during which the switch is guaranteed to be off, known as deadtime, such as may be used to allow time for the resetting of magnetic circuit components within the power supply. Thus, modulation of the PWM generator's duty cycle is limited to insure that there always exists a deadtime period.

In order to retard discharge of the timing capacitor through the switch a resistor may be coupled between a first terminal of the switch and a first terminal of the capacitor. The circuit may thus be configured such that while the timing capacitor is discharging an output switching device (e.g., transistor) may be turned off. Thus, by selecting the discharge resistor to have a predetermined value, a selected deadtime may be programmed into the circuit.

Unfortunately, it is difficult to provide a circuit which operates at a relatively fixed switching frequency and which has both voltage feed forward circuit characteristics and a duty cycle clamp. This difficulty arises due to the fact that the variable charging time of the timing capacitor tends to move the discharge time with respect to the total switching period. Either the switch frequency may vary or, at low input voltages, the capacitor may not become completely discharged by the end of the period. This results in a reduction in the deadtime interval.

In an effort to remedy this situation, the U.S. Patent to Mammano et al, U.S. Pat. No. 5,414,342 (hereinafter referred to as the '342 Patent) proposes a PWM circuit architecture, in which the timing capacitor charging current and upper threshold voltage are made proportional to input voltage. As a result, when the ramp slope increases with an increase in input voltage, the upper threshold will also increase, so that duty cycle is maintained constant. Discharge time is controlled in accordance with the resistance of a discharge resistor for a particular value of timing capacitor. A problem with this type of circuit is the fact that it is not readily suited for PWM-based power supply circuits, such as zero voltage switching (ZVS) applications, which mandate a fixed deadtime to prevent multiple switching devices that are driven by the PWM signal from being on at the same time.

SUMMARY OF THE INVENTION

In accordance with the present invention, this shortcoming is effectively remedied by augmenting the proportional-to-input voltage charging current functionality employed by the PWM circuit described in the '342 Patent to include proportional-to-input voltage discharging current functionality. To this end, the PWM waveform generator of the invention couples an input port, to which an input voltage is applied, through a buffer amplifier to respective charging and discharging control resistors. These resistors develop respective currents proportional to the input voltage, which are used to controllably charge and discharge a timing capacitor.

The buffer amplifier output is summed with a (zero or non-zero) valley threshold voltage reference to create a peak threshold voltage proportional to the input voltage. The peak threshold voltage is applied as a reference to a first comparator, and the valley threshold voltage is applied as a reference to a second comparator. The inputs to these comparators are coupled to monitor the voltage developed across a timing capacitor. The outputs of the comparators are used to control the state of a switch control latch (flip-flop), so as to form a fixed switching frequency oscillator, which controls the operation of respective capacitor charging and discharging switches. These switches are coupled with respective charging and discharging current sources, that mirror the currents through the respective charging and discharging control resistors.

In operation, at the start of a PWM ramp interval, the states of the comparators are such that the switch control flip-flop closes the charging switch and opens the discharging switch, so that charging current proportional to the input voltage is applied to the timing capacitor. This starts the rise time of the PWM ramp signal. When the ramp signal reaches the control voltage applied to an output PWM comparator, the output of that comparator goes high. When the voltage across the timing capacitor reaches the peak threshold voltage, the states of the latch outputs are reversed. As a result, the charging switch is opened, terminating the flow of charging current to the capacitor, and the discharging switch is closed.

With the discharging switch closed, the timing capacitor is discharged by a current that is proportional to input voltage. As in the case of the rise time of the ramp signal, the higher the input voltage, the greater the slope of the fall time of the ramp signal, whereas the lower the input voltage, the more gradual the fall time of the ramp signal. In either case, because the fall time of the ramp signal is proportional to the input voltage, the deadtime interval of the PWM signal is predictably constant, as intended. As the timing capacitor is discharged by the discharging current source, its voltage eventually reaches the valley threshold voltage which resets the flip-flop and starts the rise time of the next PWM waveform cycle.

BRIEF DESCRIPTION OF THE DRAWINGS

The single FIGURE diagrammatically illustrates an embodiment of a constant deadtime PWM generator in accordance with the present invention.

DETAILED DESCRIPTION

Figure 1:
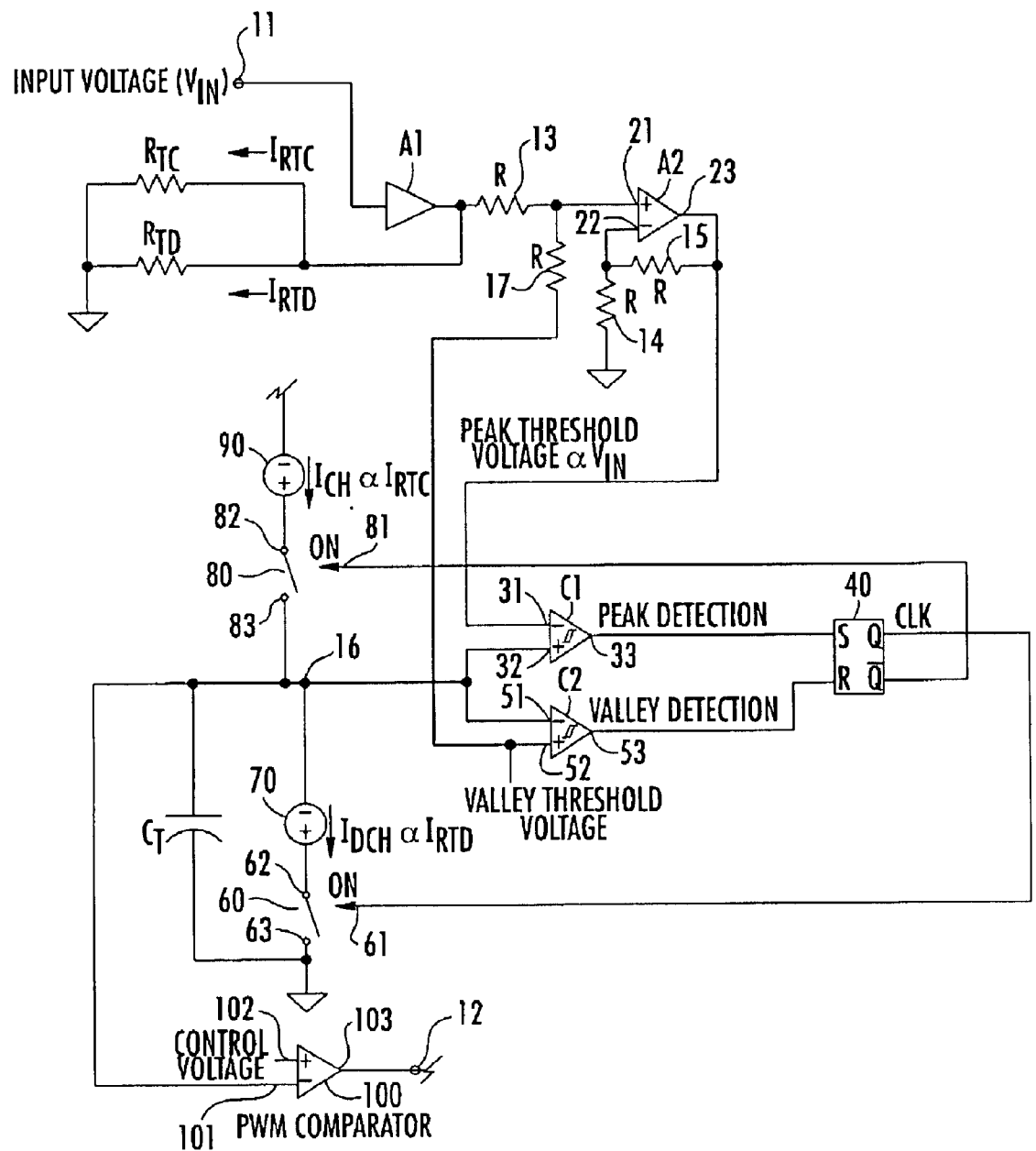

Before detailing the constant deadtime pulse width modulator circuit of the present invention, it should be observed that the invention resides primarily in a prescribed arrangement of conventional digital and analog circuits and components. As a consequence, the configuration of such circuits and components have, for the most part, been depicted in the drawings by a readily understandable block diagram which shows only those details that are pertinent to the present invention, so as not to obscure the disclosure with features which will be readily apparent to those skilled in the art having the benefit of the description herein. Thus, the diagrammatic illustration herein is primarily intended to show a non-limiting implementation of the invention in a convenient functional grouping, whereby the present invention may be more readily understood.

Attention is now directed to the single FIGURE of drawings (labeled FIG. 1), wherein the constant deadtime PWM generator in accordance with the present is diagrammatically illustrated as including an input port 11, to which an input voltage $V_{IN}$ is applied, and an output port 12 from which a PWM voltage waveform is to be derived. Input port 11 is coupled through a buffer amplifier A1 having a gain less than 1 to a charging control resistor $R_{TC}$ and a discharging control resistor $R_{TD}$, each of which is referenced to ground. These resistors develop respective currents $I_{RTC}$ and $I_{RTD}$ that are proportional to $V_{IN}$, and are used to determine the charge and discharge currents of a timing capacitor $C_T$, that is coupled between a node 16 and ground (GND). The output of buffer amplifier A1 is further coupled through a summing resistor 13 to the non-inverting (+) input 21 of an operational amplifier A2, the inverting (−) input 22 of which is coupled through a resistor 14 to ground and through a feedback resistor 15 to the output 23 of amplifier A2. The non-inverting input 21 of amplifier A2 is further coupled through a summing resistor 17 to a valley threshold voltage reference, which has a prescribed zero or non-zero value. Each of resistors 13, 14, 15 and 17 has a prescribed resistance value R.

Amplifier A2 sums the output of amplifier A1 and the valley threshold voltage to create a peak threshold voltage. Since the output of amplifier A1 is proportional to input voltage the output of amplifier A2 is proportional to input voltage so that the peak threshold voltage varies in proportion to the input voltage. The output 23 of amplifier A2 is coupled to an inverting (−) input 31 of a first (peak detection) comparator C1. The non-inverting (+) input 32 of comparator C1 is coupled to node 16. The output 33 of comparator C1 is coupled to the set (S) input 41 of a switch control flip-flop 40.

Node 16 is further coupled to an inverting (−) input 51 of a second (valley detection) comparator C2. The non-inverting (+) input 52 of comparator C2 is coupled to valley threshold voltage reference. The output 53 of comparator C2 is coupled to the reset (R) input 42 of flip-flop 40. As pointed out briefly above, and as will be appreciated from the subsequent description of the operation of the constant deadtime controller of the invention, comparators C1 and C2 control the state of a flip-flop 40, so as to form a fixed switching frequency oscillator, that controls the operation of respective capacitor discharging and charging switches 60 and 80.

To this end, the Q output 43 of flip-flop 40 is coupled as a control input 61 for a timing capacitor discharge switch 60, an input 62 of which is coupled to a discharge current source 70, and an output 63 of which is coupled to ground. Current source 70, which may be implemented as a current mirror, is operative to generate an output current in proportion to the current $I_{RTD}$ flowing through resistor $R_{TD}$. The QBAR output 44 of flip-flop 40 is coupled as a control input 81 for a timing capacitor charge switch 80, an input 82 of which is coupled to a charging current source 90, and an output 83 of which is coupled to node 16. Current source 90, which also may be implemented as a current mirror, is operative to generate an output current in proportion to the current $I_{RTC}$ flowing through resistor $R_{TC}$. Node 16 is further coupled to the inverting (−) input 101 of a PWM comparator 100, an inverting input 102 of which is coupled to receive a duty cycle control voltage. The output 103 of comparator goes high when the voltage at node 101 reaches its control voltage level and goes low when the voltage at node 101 drops below the control voltage level. Thus, comparator 100 operates in a conventional manner to produce a PWM waveform, whose duty cycle is controlled by the control voltage.

The constant deadtime controller of the present invention operates as follows. Considering the start of a respective cycle of the PWM waveform, in response to the application of input voltage $V_{IN}$ to input port 11, charging control resistor $R_{TC}$ and discharging control resistor $R_{TD}$ develop respective currents $I_{RTC}$ and $I_{RTD}$ that are proportional to $V_{IN}$. These two input voltage proportional currents are mirrored by current sources 90 and 70 as a charging current $I_{CH}$ and a discharging current $I_{DCH}$, respectively. With switch control flip-flop 40 in its reset state, its QBAR output causes switch 80 to be closed, so that the charging current $I_{CH}$ is applied to node 16 and charges capacitor $C_T$. This starts the rise time of a ramp signal appearing at node 16 and applied to the ramp signal input 101 of PWM comparator 100. When the ramp signal reaches the control voltage applied to comparator 100 its output goes high, as described above. Since the timing capacitor charging current is proportional to input voltage, then the higher the input voltage the greater the slope of the rise time of the ramp signal at node 16, and the sooner the PWM voltage waveform at output port 12 goes high, whereas the lower the input voltage the more gradual the rise time of the ramp signal, and the later the PWM waveform at output port 12 goes high.

When the voltage across capacitor $C_T$ reaches the peak threshold voltage as determined by amplifier A2, the output 33 of comparator C1 changes state, setting switch control flip-flop 40. This causes the QBAR output of flip-flop 40 to go low and its Q output to go high. With the flip-flop QBAR output low, switch 80 is opened, terminating the flow of charging current to timing capacitor $C_T$ and defining the peak of the rise time portion of the ramp signal.

Since the Q output of flip-flop 40 is high, switch 60 is now closed, so that the current generated by current source 70 begins discharging capacitor $C_T$ with discharging current $I_{DCH}$ which, as noted above, is proportional to the input voltage $V_{IN}$. Thus, as in the case of the rise time of the ramp signal, the higher the input voltage, the greater the slope of the fall time of the ramp signal, whereas the lower the input voltage, the more gradual the fall time of the ramp signal. As described previously, in either case, because the fall time of the ramp signal is proportional to the input voltage, the deadtime interval of the PWM signal produced at the output of comparator 100 is predictably constant, while the switching frequency remains invariant, as intended.

As capacitor $C_T$ is discharged by current source 70, the voltage at node 16 eventually reaches value of the control voltage of the PWM comparator 100, causing the output of comparator 100 to change state and terminate the high state of the PWM output waveform. As node 16 continues to discharge it also eventually reaches the valley threshold voltage applied to the non-inverting input (+) 52 of comparator C2, causing its output 33 to change state. This resets flip-flop 40, so that its QBAR output again goes high and its Q output goes high. With flip-flop 40 reset, switch 60 is opened, to terminate the discharging of capacitor $C_T$ and thereby the fall time of the ramp signal. With switch 80 closed and switch 60 opened, the next cycle of the PWM ramp and output waveform is initiated and proceeds as detailed above.

While I have shown and described an embodiment in accordance with the present invention, it is to be understood that the same is not limited thereto but is susceptible to, numerous changes and modifications as known to a person skilled in the art. I therefore do not wish to be limited to the details shown and described herein, but intend to cover all such changes and modifications as are obvious to one of ordinary skill in the art. As a non-limiting example, a single current charge and discharge resistor may be employed in lieu of the charging and discharging resistor pair $R_{TC}$ and $R_{TD}$ described above, with respective current mirror-based current generators referenced to the current flowing through the common resistor. What is important is that each of the charging and discharging currents be proportional to input voltage. Also, a digital implementation of functionality of the various components of the invention may be employed. For example, in such an instance a counter may be controllably incremented and decremented by respective clock sources whose clock rates are made proportional to input voltage, in place of the charging and discharging of a timing capacitor.

What is claimed:

1. In a pulse width modulator in which a periodic ramp signal is compared in a comparator with a control voltage to control respective states of a pulse width modulation signal, a respective cycle of said periodic ramp signal being generated by controlling charging of a capacitor with a charging current generated by a controlled capacitor charging circuit to which an input voltage of said pulse width modulator is coupled, said controlled capacitor charging circuit being operative to initiate charging of said capacitor with said charging current that is proportional to said input voltage until the voltage across said capacitor reaches a first threshold and thereupon discharging said capacitor, until said voltage across said capacitor reaches a second threshold, the improvement comprising a controlled capacitor discharging circuit that is coupled to said capacitor and operative to discharge said capacitor with a discharge current that varies in proportion to a variation in said input voltage of said pulse width modulator.

2. The improvement according to claim 1, wherein said first threshold is proportional to said input voltage of said pulse width modulator.

* * * * *